United States Patent [19]
Herklotz et al.

[11] Patent Number: 5,656,110
[45] Date of Patent: Aug. 12, 1997

[54] PROCESS AND APPARATUS FOR PRODUCING A LAMINATED STRIP OF A METAL FOIL AND A PLASTIC FILM

[75] Inventors: Gunter Herklotz, Bruchkobel; Karl-Heinz Ullrich, Gross-Umstadt; Thomas Loose; Friedrich Lach, both of Hasselroth; Alfred Bauer, Alzenau; Horst Hartmann, Hanau, all of Germany

[73] Assignee: W.C. Heraeus GmbH, Hanau, Germany

[21] Appl. No.: 353,362

[22] Filed: Dec. 2, 1994

[30] Foreign Application Priority Data

Dec. 2, 1993 [DE] Germany .............. 43 40 996.2
Apr. 2, 1994 [DE] Germany .............. 44 11 618.7

[51] Int. Cl.⁶ .................................................. B32B 31/08
[52] U.S. Cl. ................. 156/64; 156/199; 156/209; 156/290; 156/361; 156/363
[58] Field of Search ............... 156/64, 196, 199, 156/209, 219, 290, 324, 361, 362, 363

[56] References Cited

U.S. PATENT DOCUMENTS

| | | | |
|---|---|---|---|
| 3,956,077 | 5/1976 | Hamby, Jr. et al. ............ | 156/209 X |
| 4,264,397 | 4/1981 | Kawashima et al. .......... | 156/361 |
| 4,305,897 | 12/1981 | Hazama et al. ............. | 156/290 X |
| 4,503,110 | 3/1985 | Skene ........................ | 156/209 X |
| 4,517,036 | 5/1985 | Elworthy et al. ............ | 156/64 |
| 4,520,060 | 5/1985 | Blümle ...................... | 156/64 X |
| 4,735,663 | 4/1988 | Hasegawa ................... | 156/64 |
| 4,829,375 | 5/1989 | Alzmann et al. ............ | 358/101 |
| 4,836,874 | 6/1989 | Foster ....................... | 156/209 |
| 4,854,984 | 8/1989 | Ball et al. .................. | 156/290 X |
| 5,048,178 | 9/1991 | Bindra et al. .............. | 156/64 X |

FOREIGN PATENT DOCUMENTS

| | | | |
|---|---|---|---|
| 569811 | 2/1959 | Canada .................... | 156/209 |
| 395871 | 11/1990 | European Pat. Off. ..... | 156/290 |
| 3430440 | 5/1986 | Germany ................... | 156/290 |
| 2122538 | 1/1984 | United Kingdom ......... | 156/290 |
| WO92/15118 | 9/1992 | WIPO . | |
| 94/016889 | 8/1994 | WIPO ....................... | 156/64 |

Primary Examiner—David A. Simmons
Assistant Examiner—Paul M. Rivard
Attorney, Agent, or Firm—Finnegan, Henderson, Farabow, Garrett & Dunner, L.L.P.

[57] ABSTRACT

A process and apparatus for producing a laminate containing a metal foil strip and a plastic film strip, in which the two strips have stamped structures repeated at regular intervals in the longitudinal direction of the strips and are disposed at contiguous points in the laminate, a pre-stamped strip and the second strip being continuously joined together from one end. To laminate stamped plastic film tape together with a pre-stamped metal foil tape, with the least possible complexity, so that any mismatch between the stamped structures of the two tapes is as small as possible, after the strips have been merged, the position of position markings for the stamped structures in the second strip and on the pre-stamped strip are successively scanned and, once a predetermined position of the position markings has been reached, a stamped structure is introduced into that region of the second strip situated in front of the site of the joining together, at a distance from the predetermined position corresponding to an integral multiple of the interval at which the stamped structures of the pre-stamped metal strip are repeated.

8 Claims, 1 Drawing Sheet

PROCESS AND APPARATUS FOR PRODUCING A LAMINATED STRIP OF A METAL FOIL AND A PLASTIC FILM

BACKGROUND OF THE INVENTION

This invention relates to a process for producing a laminate of a metal foil strip and a plastic film strip, in which the two strips have stamped structures which are repeated at regular intervals in the longitudinal direction of the strips and are disposed at contiguous points in the laminate, a pre-stamped first strip and a second strip having the stamped structures stamped therein by the process of the invention being continuously joined together from one end to form the laminate.

The invention further relates to an apparatus for producing a laminate of a metal foil strip and a plastic film strip that have stamped structures which are repeated at regular intervals, which apparatus has a feeding and guiding device for the laminate, a joining apparatus for the fixed connection of the two strips and feeding and guiding devices for the merging and joining together of the two strips.

From WO-92/15118 which is incorporated herein by reference it is known to bring together two strips, each of which has stamped markings thereon, one on top of the other in such a way that the markings of one strip coincide in the laminate with the markings of the second strip. To this end, the position of the markings in the laminate is monitored and any mismatch between the markings is eliminated by measuring the size of this mismatch. According to the size of the mismatch, the two strips, prior to being joined together, are then subjected to different temperatures in order, by virtue of the different expansion of the two strips, to equalize the strips and eliminate the mismatch. In addition, one strip can be subjected to a tensile stress, so that the expansion thereby of this strip helps to eliminate the mismatch. A process of this type, however, requires highly complex equipment to realize the different temperatures required to be applied to the two strips and to guarantee that the necessary temperature alterations can be effected in a very short time to enable the segment of the laminate having the mismatch to be kept as small as possible. The control circuit required for such an adjustment by means of temperature alterations or tensile stresses is very complicated and generally non-reactive. Furthermore, it is difficult to connect two foils/films fixedly together under such conditions since, after the tensile force has dropped away or after the temperatures of the two strips in the laminate have been matched, thermomechanical stresses can arise between the two strips, which might result in the laminate becoming deformed or the two strips becoming detached from each other.

In addition, the so-called TAB-process (Tape Automatic Bonding) is known. In this process, a plastic strip is used as a pre-stamped carrier film, onto which a metal foil is applied. The metal structure is then produced by chemical etching.

In view of the above-described prior art, an object of the present invention is to provide a process and apparatus in which a stamped plastic film tape can be laminated together with a stamped metal foil tape such that, with the least possible complexity, any mismatch between the stamped structures of the two tapes is kept as low as possible.

SUMMARY OF THE INVENTION

According to the invention, this object is achieved by the fact that, after the strips have been merged, the position of position markings for the stamped structures in the second strip bearing against a pre-stamped first strip are successively scanned and, once a predetermined position of the position markings has been reached, a stamped structure is introduced into that region of the second strip situated in front of the site of the merging, at a distance from the predetermined position corresponding to an integral multiple of the interval at which the stamped structures are repeated in the pre-stamped strip. It is generally expedient for the pre-stamped strip to be a metal foil and for the second strip to be made of plastic. It is also, however, conceivable to pre-stamp the plastic strip. In this case, the position of each stamped structure in the metal strip is determined and this position transferred, in a type of copying operation, to the plastic strip, the stamping of the plastic strip being effected at such an interval that the stamped structures of the two strips, after the strips have been joined together, are disposed at the same point on the laminate. The mismatch between the structures of the metal strip and of the plastic strip is then simply determined by tolerances in the distance between the scanning point and the site of the stamping of the plastic film. This distance can be reduced to just a few multiples of the interval at which the stamped structures of the metal strip are repeated. As a result of this and by precise pinpointing of the site of the stamping of the plastic strip, the accuracy of the position of the stamped structures in the plastic strip can be increased virtually at will. In this process, only the start of the plastic strip, namely on the section between the first position marking and the site of the stamping, exhibits no stamped structure, so that it is only necessary to discard that part-piece of the finished laminate which corresponds to this first piece.

Advantageously the plastic strip is provided, prior to the merging of the strips, at least partially with markings, namely in its initial region over a length corresponding to the distance between the scanning point and the site of the stamping, the position of which markings corresponds to the position of the position markings of the metal strip. This can be achieved, for example, by virtue of this first part-piece of the plastic strip, in the same stamping device in which the structure of the metal strip is stamped, being provided with the markings also used for the metal strip, which markings are utilized as position markings, i.e., as those markings which are scanned as the strips are brought together. As a result of the scanning of mutually corresponding position markings of both strips which is thus possible, a mismatch can already be identified during the scanning operation, which mismatch can be equalized by altering the site of the stamping of the plastic film.

Expediently, the strips are bonded together following the scanning, since the two strips exhibit different thermal expansion coefficients, they are heated only after the scanning operation (the bonding generally being expediently effected under heat influence). This prevents the two strips, in the region of the scanning or between the scanning and the site of the stamping of the plastic strip, from being variously expanded and hence prevents inaccuracies arising as the two strips are joined together. It is expedient in this case to affix the strips, in a first step, by means of individual small-area bonding points and subsequently, in a second step, to bond them over a large area. The foil/film strips are thereby fixed together, in their position relative to each other, under purely punctiform heating and are only subsequently, in the second bonding step, heated over a large area, so that any varying expansion of the two strips during heating does not lead to warping or to a relative change of position of the stamping markings.

The accuracy of the joining together of the two strips can be further enhanced by the fact that after the strips have been merged, the stamped structures of the strips are visually monitored, and by the fact that, when a predetermined deviation of the position of the stamped structures of the plastic strip from the position of the stamped structures of the metal strip is exceeded, the distance between the scanned predetermined position and the site of the stamping of the plastic strip, which site is characterized by a stamping tool, is corrected. This correction can be effected manually by an operator or via an automatic control system, by the stamping tool being adjusted in the corresponding direction by the amount of the mismatch. In this case, corrections both in the direction of running of the strips and perpendicular thereto can be carried out.

It is expedient for circular position markings of the stamped structures of the metal strip to be scanned and compared with the position of circular markings introduced into the plastic strip prior to the merging of the strips, the arrangement of which circular stampings on the plastic strip corresponds to the arrangement of the circular position markings of the stamped structures on the metal strip. The scanning can in this case expediently be effected by means of a spike. The scanning and comparison of circular structures is substantially simpler and yields clearer results than is possible in the scanning of other shapes. In principle, however, other shapes such as rectangles or triangles are also possible as position markings. The shape of the spike is in this case advantageously matched to the shape of the position markings.

The object of the invention is achieved, for the apparatus characterized in the introduction, by the fact that behind the site of the merging of the two strips there is disposed a scanning apparatus for detecting the position of the stamped structures of the pre-stamped strip, and by the fact that this scanning apparatus is coupled with a stamping tool disposed in front of the site of the merging of the two strips, the distance of the scanning apparatus from the stamping tool corresponding to an integral multiple of the interval at which the stamped structures of the pre-stamped strip are repeated. The position of the structures to be stamped in the second strip is in this case determined by the position of the stamped structures in the pre-stamped strip, thereby ensuring a mismatch-free contiguity within the laminate. Any mismatch of the two strips can be identified early and corrected by adjustment of the stamping tool relative to the scanning apparatus.

It is expedient for the scanning apparatus to contain a feeding device, thereby enabling the scanning operation to be coupled with the feed.

It is advantageous in this case if the stamping tool has an adjusting device, which allows an adjustment of the stamping tool in the direction of running of the strips and/or transversely thereto (x and y-directions).

It is advantageous for the scanning apparatus to contain a spike as a scanning element. By means of such a spike, it is possible, in a relatively easy manner, to detect the position of the stamped structures.

It is likewise possible, of course, and should be expressly covered by the invention, for the stamped structures to be introduced into the strips not by using a conventional stamping tool, but in a different fashion, for example by means of a laser beam.

BRIEF DESCRIPTION OF THE DRAWINGS

The invention is explained in greater detail in the drawings, which illustrate an embodiment thereof, in which.

DETAILED DESCRIPTION OF THE INVENTION

Figure 1:
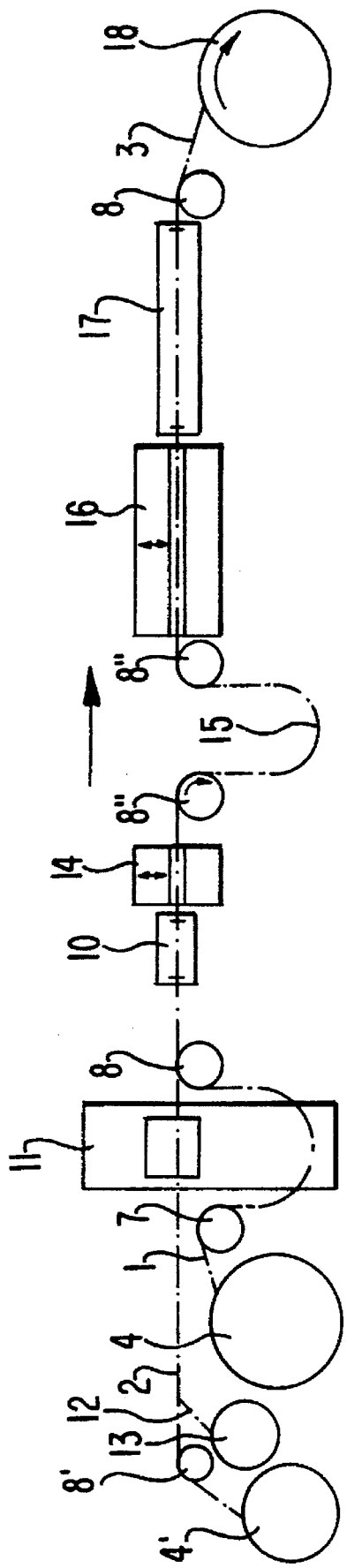
FIG. 1 shows diagrammatically an apparatus according to the invention, including a strip guide.

In accordance with the invention, a metal foil strip or tape 1 and plastic film strip or tape 2 to produce laminate 3 are fed separately to the apparatus shown in FIG. 1. Metal strip 1 is supplied from a supply roller 4. It is already pre-stamped, i.e., it already includes the stamped structures 5 assigned to it. It also includes a circular position marking 6 for each row of stamped structures 5. Metal strip 1 is fed via a feed roller 7 and a guide roller 8 to a scanning apparatus 10. The scanning apparatus 10 serves as a feeding device for the strip 1.

The plastic strip 2 is likewise supplied from a supply roller 4. The plastic strip 2 is fed via guide roller 8', past a stamping tool 11 for the strip and then, likewise to the scanning apparatus 10, which also serves as a feeding device for strip 2. A protective film 12, originally present on the plastic strip 2, is removed by winding it onto a disposal roller 13 prior to the passage of the plastic strip 2 through stamping tool 11. The plastic strip 2 is provided, at least in the space between the scanning apparatus 10 and the stamping tool 11, with circular position markings 6', the position of which on the plastic strip 2 corresponds to the position of the circular position markings 6 on the metal strip 1.

As the plastic strip 2 and metal strip 1 are introduced into scanning apparatus 10, the two strips are disposed such that their position markings 6,6' coincide and thus are located one on top of the other. In accordance with the invention, stamping tool 11 is located at a distance from scanning apparatus 10 by an integral multiple of the interval at which the stamped structures 5 on the metal strip 1 are repeated. Scanning apparatus 10 contains a spike not shown in the drawing as the scanning element. The spike locates the position markings of metal strip 1 and plastic strip 2 one on top of the other and simultaneously serves as a feeding device. It moves the strips step by step over a distance which is equivalent to the distance between two stamped structures to provide stamped structures in the plastic strip at constant intervals (for example 57 mm). The spike goes up and down in the position markings of both strips.

The determinant of the distance between scanning apparatus 10 and stamping tool 11 is the distance between the spike and the stamping element of the stamping tool 11, which stamps the circular position markings 6' and the stamped structures 5' in the plastic strip 2. In the example represented, the stamped structures 5,5' of the strips are repeated at an interval of around 56 mm. The distance between the scanning apparatus 10 and the stamping tool 11 consequently corresponds to an integral multiple of this distance. A roughly 8–12 fold interval has proved to be favorable. With such an arrangement it is possible to reduce the mismatch between the individual stamped structures 5,5' of the two strips to less than 50 µm.

Since the supply rollers 4,4', stamping tool 11, and scanning apparatus 10 can all be disposed in an air-conditioned room, inaccuracies caused by temperature fluctuations are able to be prevented.

During the process, the position of position markings 6 in the metal strip 1 is identified and, in accordance with this position, the position of the stamped structures in the plastic strip 2 is known.

Figure 2:
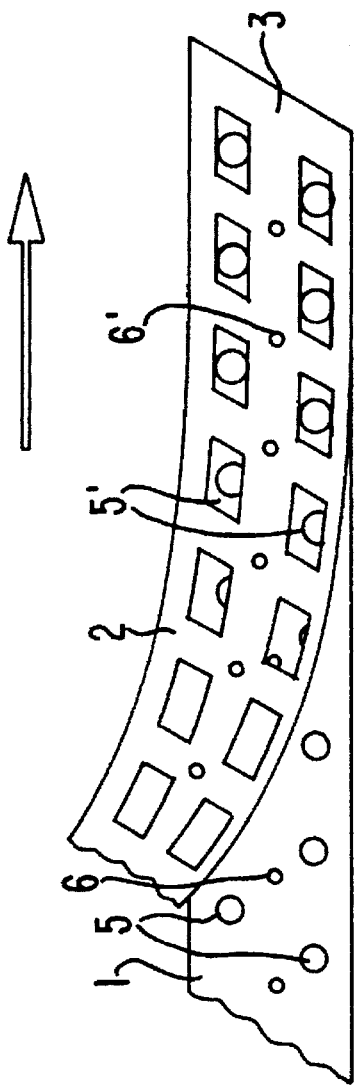
FIG. 2 shows the merging of the two strips according to the process and apparatus of the invention.

FIG. 2 shows the merging of the two strips. The representation of the start of the laminate, which does not include stamped structures 5' in plastic strip 2, has been omitted in this case. The stamped structures 5,5' of the two strips are laid against each other during the operation and the mismatch between the two is minimized by means of the position markings 6,6' as described above.

Following the passage of the strips through the scanning apparatus 10, the strips are fed, by means of the feeding device of the scanning apparatus 10, to a joining apparatus 14, where the two strips are affixed for about 1 to 2 seconds at around 170° C. The strips are guided in this case by guide pins (not shown in the drawing), which engage in the circular position markings 6,6' of the strips. By virtue of this guidance by means of the guide pins, the guidance being expediently effected by at least two guide pins, the strips are prevented from becoming misaligned as they are joined together. The strips which are affixed in the joining apparatus 14 are fed via guide rollers 8", in a loose loop 15, to a laminating apparatus 16, in which the two strips are tightly bonded together for about 30 seconds at around 180° C. to form laminate 3. Both bonding operations run in a clocked manner, the guidance of the strips in a loose loop 15 between joining apparatus 14 and the laminating apparatus 16 compensates the different clock times. Emerging from the laminating apparatus 16, the laminate 3 is fed by a feed unit 17 to the end roller 18. Prior to further processing of the laminate 3, for example into IC-card-modules, only the first part of the laminate 3 has to be cut off for a distance corresponding to the distance between the scanning apparatus 10 and the stamping tool 11 and discarded. This length amounts, in the chosen example, to around 0.5 m and, with possible lengths of the laminate 3 ranging from 100 to 200 m, this is virtually negligible.

We claim:

1. A process for producing a laminate comprising a metal foil strip and a plastic film strip, in which each of the two strips has longitudinally spaced stamped structures which are repeated at regular intervals along the length thereof and wherein the stamped structures are disposed at contiguous points in the laminate, which process comprises the steps of:

(a) feeding a first one of said two strips in a feeding direction, said first strip having said stamped structures therein and further provided with spaced position markings each corresponding to one, or a transversely extending row, of said stamped structures;

(b) feeding a second one of said two strips in said direction, said second strip having spaced position markings at positions corresponding to at least some of said position markings on said first strip;

(c) merging the first strip and the second strip together so that one is on top of the other;

(d) feeding the merged strips to a scanning apparatus to scan the position markings on the first and second strips one on top of another and place the position markings in coincidence;

(e) with the merged strips having the position markings in coincidence, and prior to the merging of the second strip with the first strip, stamping the second strip with a stamping tool to provide stamped structures therein that are longitudinally spaced at intervals along the length thereof corresponding to those of the spaced structure of the first strip, said stamping tool being located in front of the scanning apparatus at a distance which is an integral multiple of the intervals of the stamped structures.

2. The process as claimed in claim 1, wherein the first strip is made of metal foil and the second strip is made of plastic film.

3. The process as claimed in claim 2, wherein the position markings of the plastic strip are provided in the strip by the stamping tool.

4. The process as claimed in claim 1, wherein the strips are bonded together to form the laminate following passage of the merged strips through the scanning apparatus.

5. The process as claimed in claim 4, wherein the strips, are first affixed together with a plurality of small-area bonding points and then bonded together over a larger area.

6. The process as claimed in claim 2, wherein the position markings of the stamped structures of the metal strip are circular and are scanned and compared with the position of similar circular position markings that have been introduced into the plastic strip prior to the merging of the strips, the arrangement of the circular position markings on the plastic strip corresponding to the arrangement of the circular position markings of the stamped structures on the metal strip.

7. The process as claimed in claim 6, wherein the scanning is effected by means of a spike.

8. The process as claimed in claim 7, wherein the shape of the spike is matched to the shape of the circular position markings.

* * * * *